United States Patent
Alon et al.

(10) Patent No.: US 6,791,361 B2
(45) Date of Patent: Sep. 14, 2004

(54) TECHNIQUE FOR MITIGATING GATE LEAKAGE DURING A SLEEP STATE

(75) Inventors: Elad Alon, Saratoga, CA (US); Jeffrey L. Burns, Austin, TX (US); Kevin J. Nowka, Round Rock, TX (US); Rahul M. Rao, Ann Arbor, MI (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 10/319,002

(22) Filed: Dec. 12, 2002

(65) Prior Publication Data

US 2004/0113657 A1 Jun. 17, 2004

(51) Int. Cl.[7] .......................................... H03K 19/003
(52) U.S. Cl. ........................... 326/93; 326/34; 327/544
(58) Field of Search ............................. 326/93, 31, 33, 326/34; 327/544, 546

(56) References Cited

U.S. PATENT DOCUMENTS

| | | | |
|---|---|---|---|
| 5,798,662 A | 8/1998 | Marosek et al. | ............. 327/109 |
| 6,165,846 A | 12/2000 | Carns et al. | ................ 438/264 |
| 6,348,806 B1 | 2/2002 | Okandan et al. | ............ 324/763 |
| 6,365,472 B1 | 4/2002 | Ishimaru et al. | ............. 438/301 |
| 6,380,594 B1 | 4/2002 | Kimizuka | .................... 257/371 |
| 6,437,594 B1 | 8/2002 | Bolam et al. | ................ 324/765 |
| 6,535,433 B2 * | 3/2003 | Ooishi | .................... 365/189.05 |
| 6,535,443 B1 * | 3/2003 | OuYang et al. | ............. 365/207 |
| 6,635,934 B2 * | 10/2003 | Hidaka | ........................ 257/369 |

FOREIGN PATENT DOCUMENTS

JP    2003037494 A  *  2/2003  ....... H03K/19/0948

OTHER PUBLICATIONS

Faith Hamzaoglu et al. "Circuit–Level Techniques to Control Gate Leakage for sub–100nm CMOS," High–Performance Low–Power (HPLP) Lab, ECE Department, University of Virginia, pp. 60–63, Aug. 2002.

* cited by examiner

Primary Examiner—James H. Cho
(74) Attorney, Agent, or Firm—Robert A. Voigt, Jr.; Winstead Sechrest & Minick P.C.; Casimer K. Salys

(57) ABSTRACT

A method and circuit for mitigating gate leakage during a sleep state. An input pattern may be applied to one or more of a plurality of devices in a circuit, e.g., static circuit, dynamic circuit, during a sleep state. In response to the application of the input pattern, a majority of the devices in the circuit may have a substantially identical voltage at each of its terminals, i.e., the source, gate and drain terminal, thereby mitigating gate leakage.

12 Claims, 4 Drawing Sheets

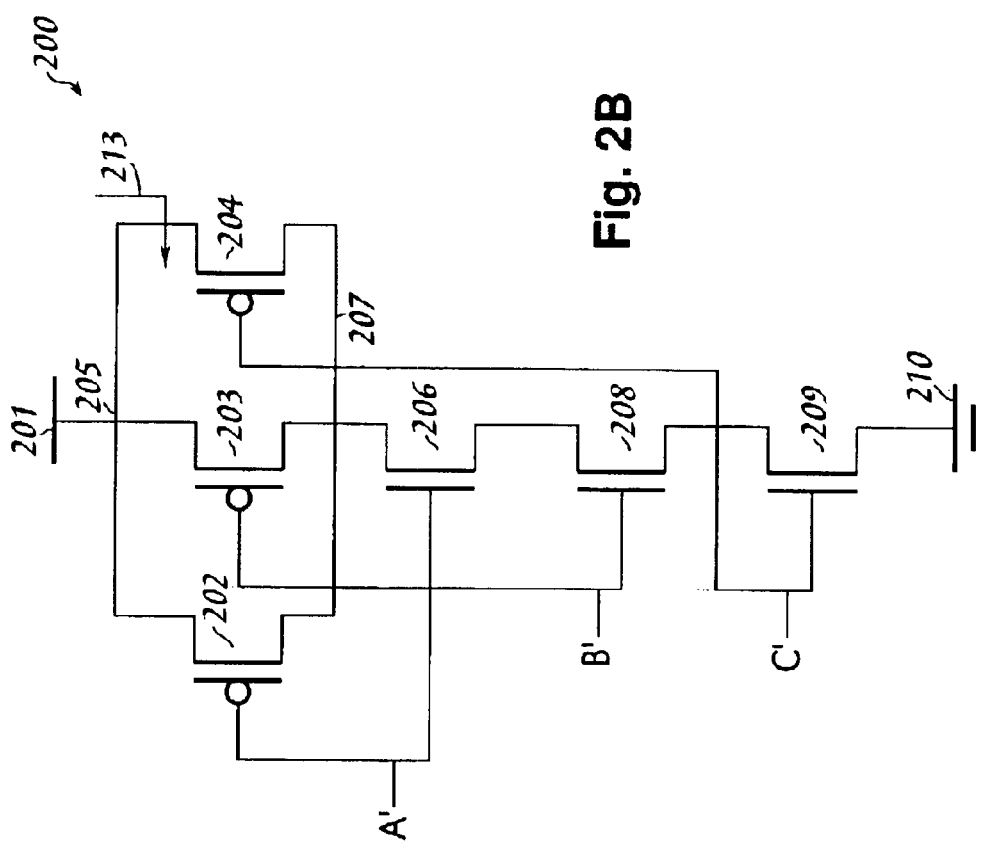
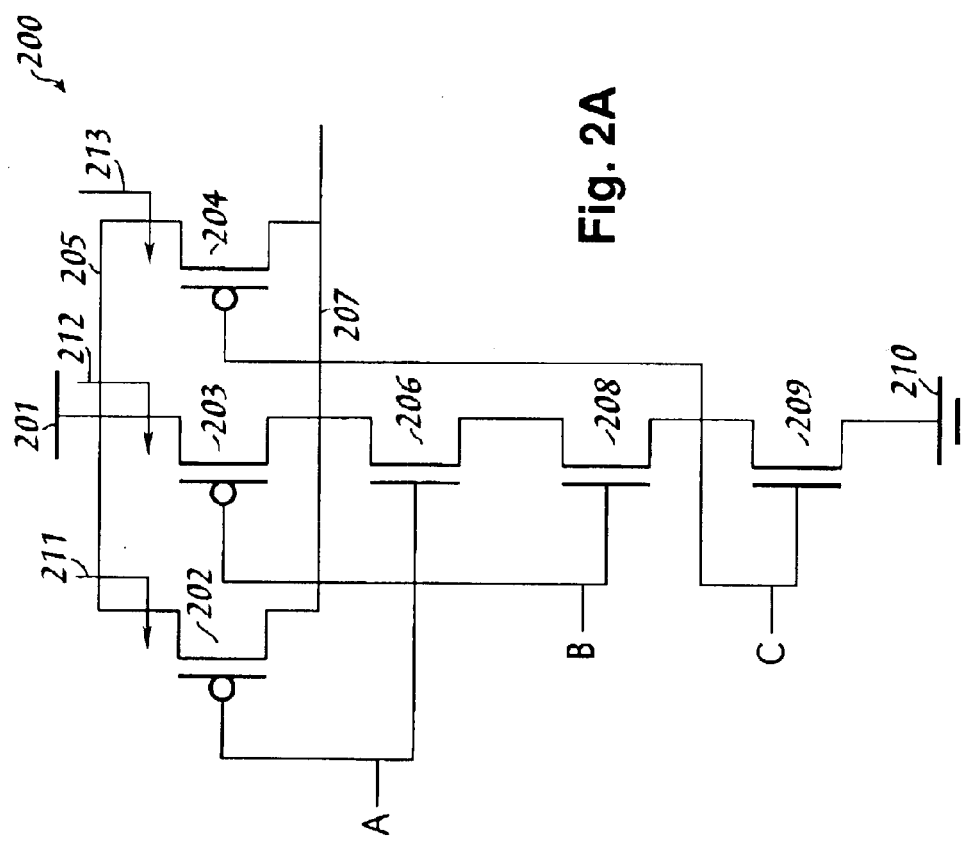
Fig. 2A
Fig. 2B

TECHNIQUE FOR MITIGATING GATE LEAKAGE DURING A SLEEP STATE

GOVERNMENT RIGHTS

The invention was made with Government support under F33615-01-C-1892 awarded by AIR FORCE RESEARCH LAB. The Government has certain rights in this invention.

TECHNICAL FIELD

The present invention relates to the field of power consumption in integrated circuits, and more particularly to mitigating transistor gate leakage during a sleep mode of integrated circuit operation.

BACKGROUND INFORMATION

The power consumption of an electronic device may be made up of two components. The dynamic power consumption relates to the power that is consumed when the device is operating. In connection with processors, the dynamic power consumption may occur when the processor's clocks are operating. The leakage power consumption may occur when the device is not operating and power continues to be consumed based on the leakage current which flows through the transistors, in the off state, that make up the electronic device.

Leakage current may include what is commonly referred to as "sub-threshold leakage" and "gate leakage." Sub-threshold leakage may refer to the current that flows in the channel of the transistor when the transistor is deactivated, i.e., turned off. Sub-threshold leakage may have an exponential dependency on the threshold voltage divided by thermal energy (kT). Hence, as the threshold voltage is decreased, the sub-threshold leakage is increased.

"Gate leakage" current may refer to the tunneling of carriers across the gate oxide of a transistor. Gate leakage may be directly related to the size of the gate oxide. The thinner the gate oxide, the greater the gate leakage.

Leakage power consumption has become a major design concern for sub-micron transistors especially in low power applications, e.g., portable computers. For example, in portable computers with battery operation, leakage power consumption may shorten the life of the battery. Consequently, techniques have been developed to mitigate leakage power consumption such as during the power saving mode of operation commonly referred to as "sleep mode" or "sleep state."

Traditionally, mitigation techniques have focused only on the sub-threshold component of the leakage current as gate leakage has traditionally been an insignificant component of the total leakage current. However, gate leakage has been increasing as the gate oxide in transistors has been made increasingly thinner thereby causing gate leakage to become a significant fraction of the total leakage current.

An idea to mitigate gate leakage has been proposed in a paper entitled "Circuit Level Techniques to Control Gate Leakage for sub-100 nm CMOS" by Fatih Hamzaoglu, et al. The proposed idea was to use more P-channel Metal Oxide Semiconductor (PMOS) transistors than N-channel Metal Oxide Semiconductor (NMOS) transistors since PMOS gate leakage is lower than NMOS gate leakage. However, this results in significant performance degradation.

Therefore, there is a need in the art to minimize transistor gate leakage without adversely effecting performance such as during the sleep state.

SUMMARY

The problems outlined above may at least in part be solved in some embodiments by producing substantially identical voltages at the source, gate and drain terminals of a majority of the transistors in a circuit during a sleep state.

In one embodiment of the present invention, a method for mitigating transistor gate leakage during a sleep state may comprise the step of applying an input pattern to one or more of a plurality of devices in a circuit during the sleep state. A substantially identical voltage may be produced at the source, gate and drain terminals of a majority of the devices in the circuit as a result of applying the input pattern thereby mitigating gate leakage.

The foregoing has outlined rather broadly the features and technical advantages of one or more embodiments of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which:

FIG. 2A illustrates a conventional method for mitigating gate leakage for a static NAND circuit;

FIG. 2B illustrates applying the principles of the present invention to mitigate gate leakage for a static NAND circuit;

DETAILED DESCRIPTION

The present invention comprises a method and circuit for mitigating transistor gate leakage during a sleep state. In one embodiment of the present invention, an input pattern may be applied to one or more of a plurality of devices in a circuit, e.g., static circuit, dynamic circuit, during a sleep state. In response to the application of the input pattern, a majority of the devices in the circuit may have a substantially identical voltage at each of its terminals, i.e., the source, gate and drain terminal, thereby mitigating gate leakage. It is noted that even though the following discusses the present invention in connection with a 3-input static NAND circuit and a 2-input dynamic NAND circuit that the principles of the present invention may be implemented in any type of static or dynamic circuit. It is further noted that embodiments implementing such static or dynamic circuits would fall within the scope of the present invention.

In the following description, numerous specific details are set forth to provide a thorough understanding of the present invention. It should be noted, however, that those skilled in the art are capable of practicing the present invention without such specific details. In other instances, well-known circuits have been shown in block diagram form in order not to obscure the present invention in unnecessary detail.

As stated in the Background Information section, traditional techniques to mitigate leakage current have focused only on the sub-threshold component of the leakage current as gate leakage has traditionally been an insignificant component of the total leakage current. However, the gate oxide in transistors has been made increasingly thinner thereby causing gate leakage to become a significant fraction of the total leakage current. Consequently, there is a need in the art to minimize transistor gate leakage.

Figure 1:
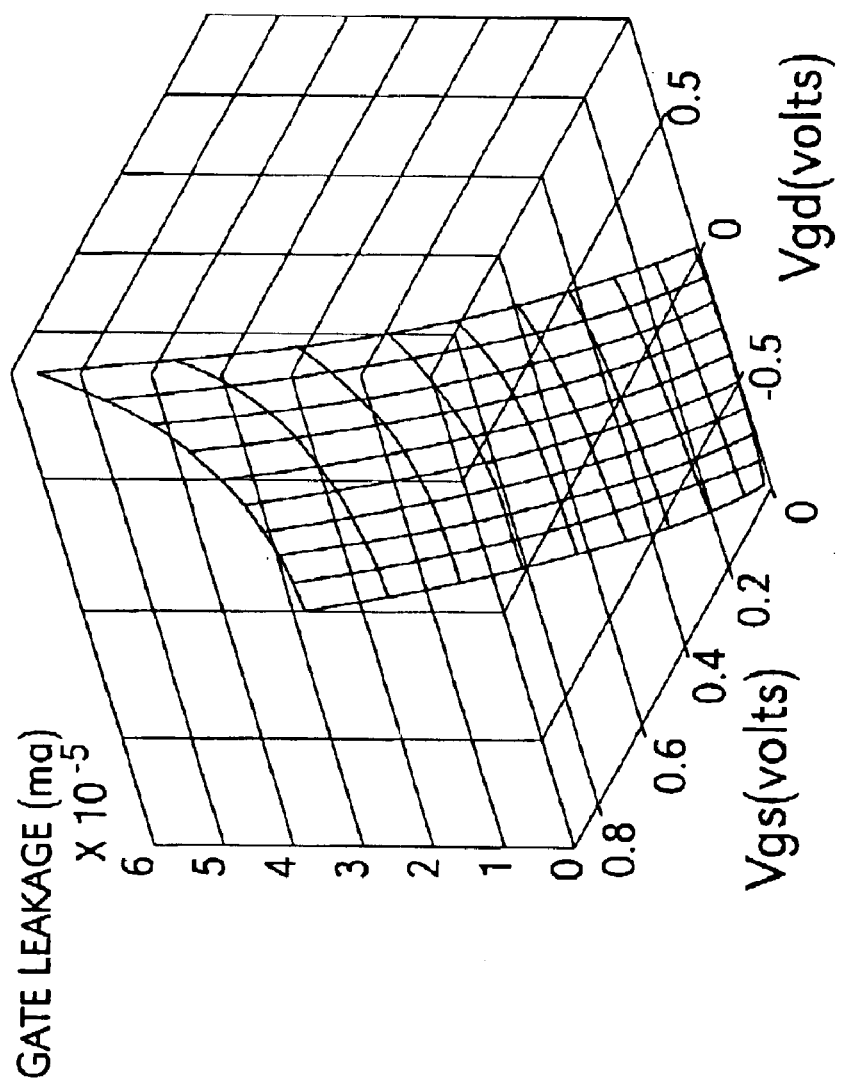
FIG. 1 is a graphical representation of the variation of the absolute value of the gate leakage with respect to the gate to source voltage and with respect to the gate to drain voltage.
Figures 3A, 3B:
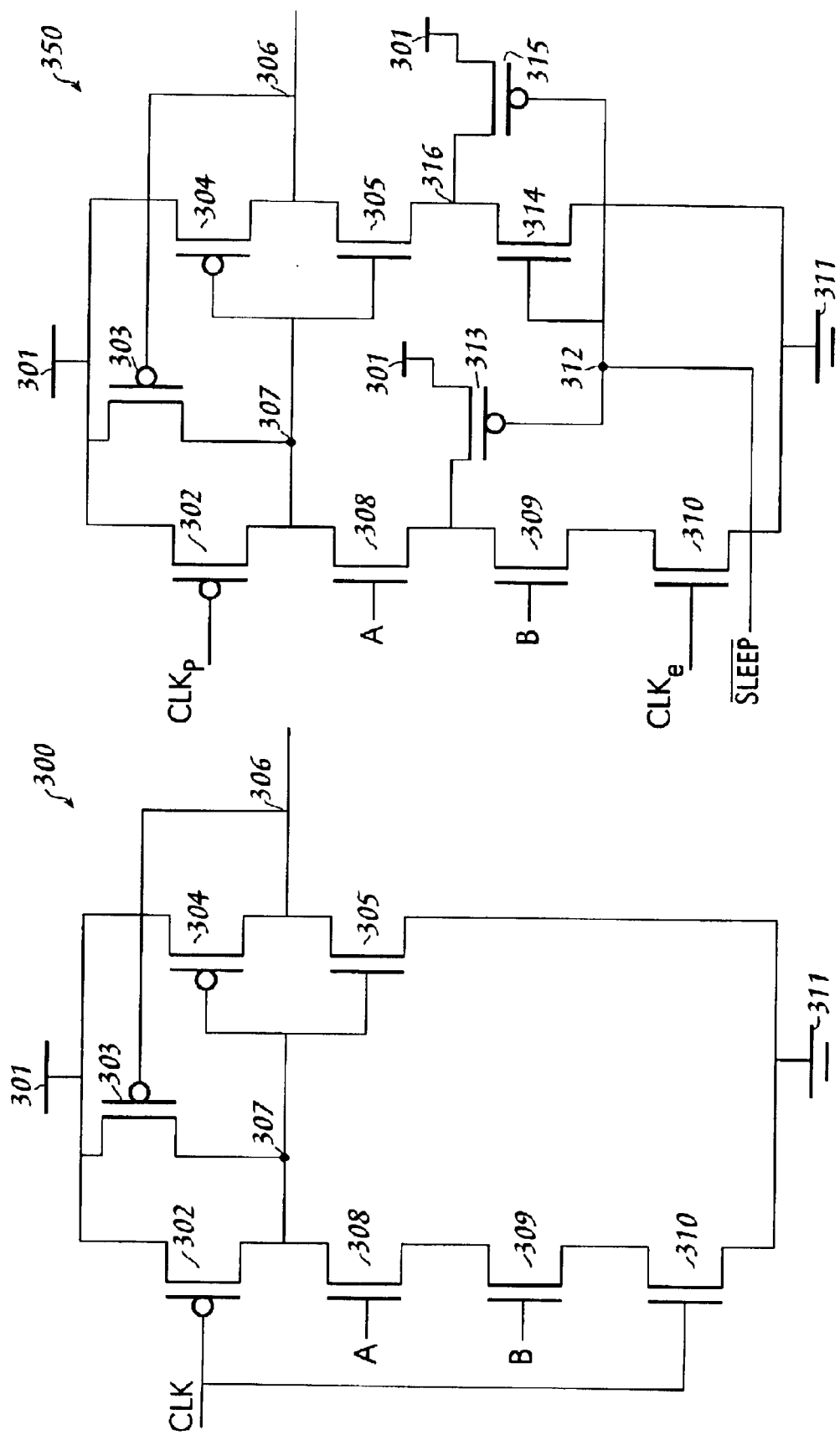
FIG. 3A illustrates a conventional NAND dynamic circuit.
FIG. 3B illustrates a modified NAND dynamic circuit configured in accordance with the present invention.
Figure 4:
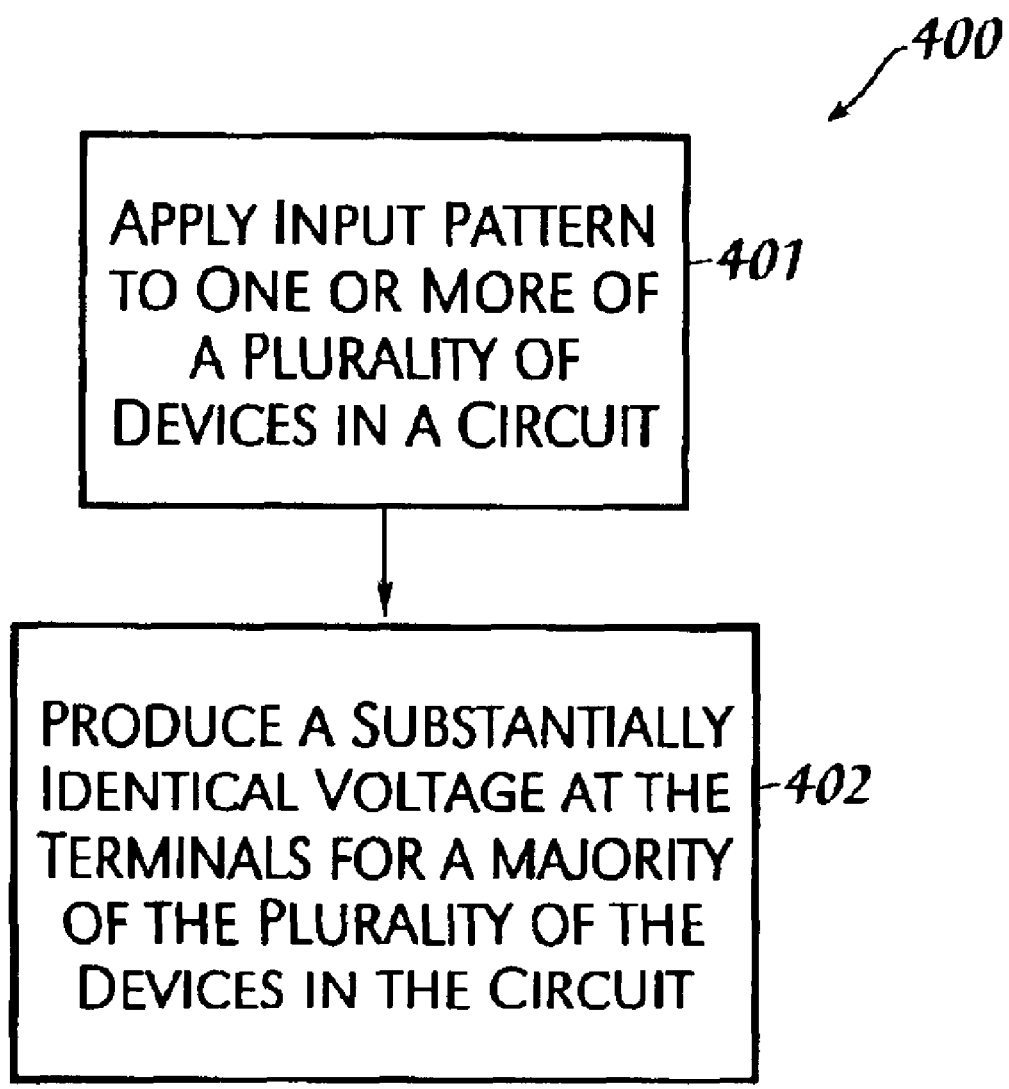
FIG. 4 is a flowchart of a method for mitigating transistor gate leakage during a sleep state in accordance with the present invention.

Gate leakage is an exponential function of the electric field across the gate oxide. That is, gate leakage is an exponential function of the gate to source and gate to drain voltages as illustrated in FIG. 1. FIG. 1 illustrates the variation of the absolute value of the gate leakage with respect to the gate to source voltage ("Vgs") and with respect to the gate to drain voltage ("Vgd"). As illustrated in FIG. 1, when an n-type transistor is activated (which occurs when Vgs is high), the worst gate leakage current for the activated transistor occurs when there is a high Vgd. As further illustrated in FIG. 1, when the n-type transistor is deactivated (which occurs when Vgs is low), the gate leakage current is maximum when Vgd is at a maximum. Consequently, in order to reduce gate leakage current, it may be necessary to produce a relatively low magnitude of Vgs and Vgd. This may be accomplished by producing a substantially identical voltage at the source, drain and gate terminals of the transistor. A discussion of mitigating gate leakage during the sleep state operation of a circuit by producing a substantially identical voltage at the source, drain and gate terminals of a majority of the transistors in the circuit is discussed below in conjunction with FIGS. 2A–B, 3A–B and 4. FIG. 2A illustrates the conventional method in minimizing leakage current for a 3-input static NAND circuit. FIG. 2B illustrates applying the principles of the present invention to mitigate gate leakage for the 3-input static NAND circuit thereby reducing the total leakage power consumed at a greater amount than the conventional method. FIG. 3A illustrates a traditional 2-input dynamic NAND circuit. FIG. 3B illustrates a modified 2-input dynamic NAND circuit applying the principles of the present invention to mitigate gate leakage. FIG. 4 is a flowchart of a method for mitigating gate leakage for the static circuit illustrated in FIG. 2A and the dynamic circuit illustrated in FIG. 3A.

FIGS. 2A–B—Static Circuit

FIGS. 2A–B illustrate a 3-input NAND circuit 200. Circuit 200 may comprise a power source 201 coupled to p-type transistors 202, 203 and 204 at node 205. P-type transistors 202, 203 and 204 may be coupled to n-type transistor 206 at node 207. N-type transistor 206 may be coupled to n-type transistors 208 and 209 in series. N-type transistor 209 may be coupled to ground 210.

As stated above, FIG. 2A illustrates the conventional method in mitigating leakage current for circuit 200. Referring to FIG. 2A, an input pattern of 0,0,0 may be applied to inputs A, B and C during the sleep state focusing on mitigating sub-threshold leakage. By applying such an input pattern, transistors 202, 203 and 204 may be activated, i.e., turn on, and transistors 206, 208 and 209 may be deactivated, i.e., turned off, during the sleep state. Nodes 205 and 207 have a high potential. By deactivating transistors 206, 208 and 209, the output of circuit 200 becomes high thereby causing transistors 202, 203 and 204 to leak through their gate as indicated by arrows 211, 212 and 213, respectively. Further, the n-type transistors, e.g., n-type transistor 206, located near node 207 have a high Vgd and a low Vgs thereby resulting in substantial gate leakage current. While sub-threshold leakage may be reduced by applying such an input pattern, transistors 202, 203, 204 and 206 experience gate leakage. Gate leakage in circuit 200 in FIG. 2A may be mitigated by producing a substantially identical voltage at the source, drain and gate terminals of a majority of the transistors as discussed below in conjunction with FIG. 2B.

As stated above, FIG. 2B illustrates applying the principles of the present invention to mitigate gate leakage in circuit 200. Referring to FIG. 2B, an input pattern of 1,1,0 may be applied to inputs A', B' and C' during the sleep state. By applying such an input pattern, transistors 202, 203 and 209 may be deactivated and transistors 204, 206 and 208 may be activated during the sleep state. Nodes 205 and 207 have a high potential. By deactivating only transistor 209 closest to the rail in the transistor stack (transistors 206, 208 and 209), the output of circuit 200 at node 207 becomes approximately Vdd, i.e., the voltage level of power source 201. Consequently, transistors 202 and 203 may have substantially the same voltage at all their terminals, i.e., Vgs and Vgd. By having the same voltage at all their terminals, the gate leakage for transistors 202 and 203 may be substantially near zero. That is, by having the same voltage at all their terminals, Vgs and Vgd may be at a minimum resulting in near zero gate leakage. Furthermore, the voltages at the terminals, i.e., Vgs and Vgd, of transistors 206 and 208 are substantially identical thereby reducing gate leakage. Consequently, gate leakage for transistors 202, 203, 206 and 208 may be substantially zero. A significant amount of gate leakage may now only occur for transistor 204 as indicated by arrow 213. A minor amount of gate leakage may occur for transistor 209. Consequently, the overall gate leakage for circuit 200 has been lessened. Furthermore, since the lower most transistor 209 in the transistor stack (transistors 206, 208 and 209) is deactivated, the increase in sub-threshold leakage may be minimized. Consequently, the overall leakage current may be lessened for circuit 200 in FIG. 2B with respect to circuit 200 in FIG. 2A.

FIG. 3A—Conventional Dynamic Circuit

FIG. 3A illustrates a conventional 2-input NAND dynamic circuit 300. Circuit 300 may comprise a power source 301 coupled to p-type transistors 302 and 303. Power source 301 may further be coupled to an output inverter comprising p-type transistor 304 coupled to n-type transistor 305 in series. The output of circuit 300 at node 306 may be coupled to the gate of p-type transistor 303. Dynamic node 307 may be coupled to the gates of transistors 304, 305 as well as to the drains of p-type transistors 302, 303 and n-type transistor 308. N-type transistor 308 may be coupled to n-type transistors 309 and 310 in series. N-type transistors 310 and 305 may be coupled to ground 311. A clock signal may be inputted to transistor 302 ("precharge transistor") and transistor 310. Transistors 308 and 309 may receive the outputs from previously coupled dynamic circuits as designated by "A" and "B". In one embodiment, transistors 304, 308, 309 and 310 may be configured to have a wider gate area than transistor 305.

Dynamic circuits such as circuit 300 are designed to operate in two phases, a precharge phase and an evaluation phase. During the precharge phase, nodes within the dynamic circuit such as circuit 300 are set to predefined voltage levels. During the evaluate phase, the dynamic circuit nodes switch from their precharge state depending on the logic function of the dynamic switching circuit. Referring to FIG. 3A, during the precharge phase, clock signal (CLK) may have a low potential value, i.e., "0", thereby causing dynamic node 307 to have a high potential value, i.e., binary value of "1". During the evaluation phase, CLK may have a high potential value, i.e., binary value of "1", thereby causing dynamic node 307 to have a low potential value, i.e., binary value of "0".

In the sleep state, the clock signal (CLK) may be set to be either in the precharge or evaluation phase. If the evaluation phase were used during the sleep state, then as stated above CLK is "1" thereby causing a value of 0 to appear at node 307 and a binary value of "1" to appear at output node 306. Assuming that the other dynamic circuits coupled to circuit 300 are also in an evaluation phase, the outputs to the other dynamic circuits have a binary value of "1" as well. Hence, the inputs A and B have a binary value of "1". As the dynamic node has a low potential value, the input to the output inverter becomes approximately zero. Consequently, transistors 304, 308, 309 and 310 are activated, i.e., turned on. Transistors 302, 303 and 305 are deactivated, i.e., turned off. A significant amount of gate leakage may occur in transistors 304, 308, 309 and 310 as the voltage levels at the terminals, i.e., Vgs and Vgd, are not equal thereby resulting in substantial gate leakage current. A less significant amount of gate leakage may occur in transistors 302 and 305 as the voltage levels between the gate and drain terminals are not equal. Further, sub-threshold leakage may arise from the deactivated transistors 302, 304 and 305 and may be substantial. Sub-threshold and gate leakage may be reduced for circuit 300 using the precharge phase during the sleep state as discussed below.

If the precharge phase were used during the sleep state, then as stated above CLX is "0" thereby causing a binary value of "1" to appear at node 307 and a value of "0" to appear at output node 306. Assuming that the other dynamic circuits coupled to circuit 300 are also in a precharge phase, the outputs to the other dynamic circuits are "0" as well. Hence, the inputs A and B are "0". As the dynamic node has a high potential value, the input to the output inverter becomes approximately Vdd, i.e., the potential of source 301. Consequently, transistors 302, 303 and 305 are activated, i.e., turned on. Transistors 304, 308, 309 and 310 are deactivated, i.e., turned off. A significant amount of gate leakage may occur in precharge transistor 302 and transistor 305 as the voltage levels at their terminals, i.e., Vgs and Vgd, are not equal thereby resulting in substantial gate leakage current. A less significant amount of gate leakage may occur in transistors 304 and 308 as the voltage levels between the gate and drain terminals are not equal. Further, sub-threshold leakage may be significant for transistor 304 which may be configured with a wide channel. While gate and sub-threshold leakage may be reduced by using the precharge phase instead of the evaluation phase during the sleep state, gate leakage may be further reduced in circuit 300 while having similar subthreshold leakage using the principles of the present invention as discussed below.

FIG. 3B—Modified Dynamic Circuit

FIG. 3B illustrates a modified 2-input NAND dynamic circuit 350 configured in accordance with the present invention. Dynamic circuit 350 may be configured similarly to circuit 300 (FIG. 3A) except that separate precharge and evaluation clocks may be used to deactivate the precharge and evaluate transistors. Further, dynamic node 307 may be charged up by a minimum sized conditional pull-up transistor 313, through transistor 308. Further, the output inverter configuration may be modified to pull-up its input by turning off n-type transistor 305 pull-down path using another minimum sized transistor 314. Further, a sleep state signal may be used to activate p-type transistors 313, 315 thereby ensuring that dynamic node 307 and internal node 316 are pulled high. The sleep state signal may be used to activate p-type transistors 313, 315 by driving internal node 312 low during the sleep state.

Referring to FIG. 3B, circuit 350 may include the following additional elements with respect to circuit 300 (FIG. 3A). Node 312 may be coupled to a p-type transistor 313 coupled to the drain of transistor 309 and the source of transistor 308. The source of p-type transistor 313 may be coupled to source 301. Further node 312 may be coupled to n-type transistor 314 coupled to the source of transistor 305. The source of n-type transistor 314 may be coupled to ground 311. The node at the drain of n-type transistor 314 and at the source of transistor 305 may be coupled to p-type transistor 315. The source of p-type transistor 315 may be coupled to source 301. In one embodiment, transistors 313, 314 and 315 that are added to circuit 300 (FIG. 3A) may be minimum sized devices with insignificant gate areas. It is noted that circuit 350 may comprise alternative devices and/or configurations to accomplish the above modifications as outlined above using the principles of the present invention. It is further noted that a person of ordinary skill in the art would be capable of implementing such alternative embodiments and that such embodiments would fall within the scope of the present invention.

Referring once again to FIG. 3B, if the precharge phase clock had a binary value of "1", the evaluation phase clock had a value of "0" and the complement of the sleep state signal had a value of "0" (sleep state signal was asserted) during the sleep state, then a substantial number of the nodes in circuit 350 attain a high potential value thereby mitigating gate leakage in circuit 300 (FIG. 3A). That is, if the precharge phase clock had a binary value of "1", the evaluation phase clock had a value of "0" and the complement of the sleep state signal had a value of "0" during the sleep state, then a majority of the number of the transistors in circuit 350 may have a substantially identical voltage at its source, drain and gate terminals thereby mitigating gate leakage in circuit 300 (FIG. 3A).

If the complement of the sleep state signal had a value of "0" during the sleep state, then node 312 attains a value of 0. Consequently, transistors 313 and 315 become activated, i.e., turned on, and transistor 314 becomes deactivated, i.e., turned off. Further, if the precharge phase clock had a binary value of "1" and the evaluation phase clock had a value of "0", then transistors 302 and 310 become deactivated. Nodes 306 and 307 attain a binary value of "1". Consequently, transistor 305 becomes activated and transistors 303, 304 become deactivated. Assuming that circuit 350 is coupled to other similarly designed dynamic circuits, then the outputs of those other dynamic circuits are a binary value of "1" as well. Hence, the inputs A and B are a binary value of "1". Consequently, transistors 308 and 309 become activated. As a result of the above, transistors 302, 303, 304, 305, 308 and 309 have the same voltage (a binary value of "1") at all their terminals, i.e., Vgs and Vgd. By having the same voltage at all their terminals, the gate leakage for transistors 302, 303, 304, 305, 308 and 309 may be substantially near zero. A minor amount of gate leakage may occur in transistor 310 where the drain (high potential) and gate (low potential) have a different potential. Furthermore, an insignificant amount of gate leakage may occur in transistors 313, 314 and 315 as they may be minimum sized devices with insignificant gate area. Transistors 313 and 315 may exhibit a greater amount of gate leakage than transistor 314 as the source and drain have a high potential and the gate has a low potential. The source and gate of transistor 314 has a low potential and the drain of transistor 314 has a high potential. Consequently, the gate leakage for circuit 300 (FIG. 3A) may be lessened by having the terminals, i.e., Vgs and Vgd, for the majority of the transistors at substantially the same potential. Furthermore, the sub-threshold leakage for circuit 350 is approximately equal with the sub-threshold leakage for circuit 300 (FIG. 3A) when the precharge phase was used during the sleep state. Sub-threshold leakage may occur in precharge transistor 302 and transistor 314. Consequently, the overall leakage current is lessened for circuit 350 in FIG. 3B with respect to circuit 300 in FIG. 3A.

FIG. 4—Method for Mitigating Transistor Gate Leakage

FIG. 4 is a flowchart of one embodiment of the present invention of a method 400 for mitigating transistor gate leakage in a circuit, e.g., static circuit, dynamic circuit, during a sleep state.

Referring to FIG. 4, in conjunction with FIGS. 2A–B, 3A–B, in step 401, an input pattern may be applied to one or more of a plurality of devices in a circuit, e.g., static circuit 200, dynamic circuit 350, during a sleep state. Referring to FIG. 2B, an input pattern of 1,1,0 may be applied to inputs A', B' and C' during the sleep state. Referring to FIG. 3B, inputs A and B may receive a binary value of 1. The precharge phase clock may have a binary value of 1 and the evaluation phase clock may have a value of 0. The sleep state signal may be enabled during the sleep state thereby charging an internal node of circuit 350.

In step 402, a substantially identical voltage may be produced at the source, gate and drain terminals for a majority of the plurality of transistors in the circuit, e.g., static circuit 200, dynamic circuit 350, in response to the application of the input pattern. Referring to FIG. 2B, by applying input pattern 1, 1, 0 to inputs A', B' and C', transistors 202, 203 and 209 may be deactivated and transistors 204, 206 and 208 may be activated during the sleep state. Nodes 205 and 207 have a high potential. By deactivating only transistor 209 closest to the rail in the transistor stack (transistors 206, 208 and 209), the output of circuit 200 at node 207 becomes approximately Vdd, i.e., the voltage level of power source 201. Consequently, transistors 202, 203, 206 and 208 have substantially the same voltage at all their terminals, i.e., Vgs and Vgd. By having substantially the same voltage at all their terminals, the gate leakage for transistors 202, 203, 206 and 208 may be substantially near zero. A significant amount of gate leakage may now only occur for transistor 204. A minor amount of gate leakage may occur for transistor 209. Consequently, the overall gate leakage for circuit 200 in FIG. 2A has been lessened. Further, since the lower most transistor 209 in the transistor stack (transistors 206, 208 and 209) is deactivated, the increase in sub-threshold leakage may be minimized. Consequently, the overall leakage current is lessened for circuit 200 in FIG. 2B with respect to circuit 200 in FIG. 2A.

Referring to FIG. 3B, as a result of applying the input pattern to circuit 350, transistors 302, 303, 304, 305, 308 and 309 may have substantially the same voltage (a binary value of "1") at all their terminals, i.e., Vgs and Vgd. By having substantially the same voltage at all their terminals, the gate leakage for transistors 302, 303, 304, 305, 308 and 309 may be substantially near zero. A minor amount of gate leakage may occur in transistor 310 were the drain (high potential) and gate (low potential) have a different potential. Furthermore, an insignificant amount of gate leakage may occur in transistors 313, 314 and 315 as they may be minimum sized devices with insignificant gate area. Consequently, the gate leakage for circuit 300 (FIG. 3A) may be lessened by having the terminals, i.e., Vgs and Vgd, for the majority of the transistors at substantially the same potential. Furthermore, the sub threshold leakage for circuit 350 is approximately equal with the sub-threshold leakage for circuit 300 (FIG. 3A) when the precharge phase was used during the sleep state. Sub-threshold leakage may occur in precharge transistor 302 and transistor 314. Consequently, the overall leakage current is lessened for circuit 350 in FIG. 3B with respect to circuit 300 in FIG. 3A.

It is noted that method 400 may be executed in a different order presented and that the order presented in the discussion of FIG. 4 is illustrative. It is further noted that certain steps in FIG. 4 may be executed almost concurrently.

Although the circuit and method are described in connection with several embodiments, it is not intended to be limited to the specific forms set forth herein; but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

What is claimed is:

1. A method for mitigating transistor gate leakage during a sleep state comprising the steps of:

applying an input pattern to one or more of a first plurality of devices in a circuit during said sleep state; and producing a substantially identical voltage at a source, a gate and a drain terminal of each of a majority of said first plurality of devices in said circuit in response to said application of said input pattern thereby mitigating transistor gate leakage.

2. The method as recited in claim 1, wherein said circuit is a dynamic circuit.

3. The method as recited in claim 2, wherein each of said majority of said first plurality of devices have a substantially identical voltage at said source, said gate and said drain terminal by driving a precharge and an evaluation clock separately.

4. The method as recited in claim 3, wherein each of said majority of said first plurality of devices have a substantially identical voltage at said source, said gate and said drain terminal by driving an internal node to a first state during said sleep state.

5. The method as recited in claim 1, wherein said circuit is a static circuit.

6. The method as recited in claim 5, wherein one of a second plurality of devices in a transistor stack closest to a rail in said circuit is deactivated thereby minimizing an increase in sub-threshold leakage.

7. A circuit, comprising:

a power source;

a ground; and a first plurality of transistors coupled to said power source and said ground, wherein one or more of said first plurality of transistors are configured to receive an input during a sleep state, wherein a substantially identical voltage at a source, a gate and a drain terminal for each of a majority of said plurality of transistors is produced as a result of said input received thereby mitigating transistor gate leakage during said sleep state.

8. The circuit as recited in claim 7, wherein said circuit is a dynamic circuit.

9. The circuit as recited in claim 8 further comprising:

a first clock coupled to one of said first plurality of transistors, wherein said first clock drives a precharge signal; and a second clock coupled to one of said first plurality of transistors, wherein said second clock drives an evaluation signal.

10. The circuit as recited in claim 9 further comprising:

a signal coupled to an internal node of said circuit, wherein said signal is configured to drive said internal node to a first state during said sleep state.

11. The circuit as recited in claim 7, wherein said circuit is a static circuit.

12. The circuit as recited in claim 11, wherein one of a second plurality of transistors in a transistor stack closest to a rail in said circuit is deactivated thereby minimizing an increase in sub-threshold leakage.

* * * * *

UNITED STATES PATENT AND TRADEMARK OFFICE
CERTIFICATE OF CORRECTION

PATENT NO. : 6,791,361 B2
DATED : September 14, 2004
INVENTOR(S) : Elad Alon et al.

It is certified that error appears in the above-identified patent and that said Letters Patent is hereby corrected as shown below:

Column 5,
Line 26, please replace "CLX" with -- CLK --.

Signed and Sealed this

Tenth Day of May, 2005

JON W. DUDAS
*Director of the United States Patent and Trademark Office*